United States Patent [19]
Lemelson

[11] Patent Number: 5,740,941
[45] Date of Patent: Apr. 21, 1998

[54] SHEET MATERIAL WITH COATING

[76] Inventor: Jerome Lemelson, 868 Tyner Way, Incline Village, Nev. 89451

[21] Appl. No.: 471,389

[22] Filed: Jun. 6, 1995

Related U.S. Application Data

[62] Division of Ser. No. 108,103, Aug. 16, 1993, abandoned.

[51] Int. Cl.$^6$ ................................................. B65D 25/54
[52] U.S. Cl. .......................... 220/454; 220/457; 220/663; 40/584
[58] Field of Search ................................ 220/446, 454, 220/455, 457, 663; 40/584, 910

[56] References Cited

U.S. PATENT DOCUMENTS

| | | |
|---|---|---|
| 2,411,867 | 12/1946 | Brenner . |
| 2,604,229 | 7/1952 | Schwarz .................. 220/663 |
| 2,793,282 | 5/1957 | Steigerwald . |
| 2,861,166 | 11/1958 | Cargill, Jr. . |
| 2,947,610 | 8/1960 | Hall et al. . |
| 2,968,723 | 1/1961 | Steigerwald . |
| 3,099,083 | 7/1963 | De Long . |
| 3,141,746 | 7/1964 | De Lai . |
| 3,306,720 | 2/1967 | Darrow . |
| 3,346,458 | 10/1967 | Schmidt . |
| 3,361,448 | 1/1968 | Warrington . |
| 3,371,404 | 3/1968 | Lemelson . |
| 3,378,446 | 4/1968 | Whittlesey . |
| 3,396,595 | 8/1968 | Niemann . |
| 3,461,197 | 8/1969 | Lemelson . |
| 3,489,645 | 1/1970 | Daiber et al. . |
| 3,602,209 | 8/1971 | Bocker . |
| 3,702,573 | 11/1972 | Nemeth . |
| 3,714,332 | 1/1973 | Rasquin et al. . |
| 3,913,280 | 10/1975 | Hall . |
| 3,916,506 | 11/1975 | Wolf . |
| 3,942,669 | 3/1976 | Savage, Jr. ................. 220/663 |
| 3,959,557 | 5/1976 | Berry . |
| 3,967,215 | 6/1976 | Bellak . |
| 4,054,426 | 10/1977 | White . |
| 4,074,011 | 2/1978 | Teramae et al. . |
| 4,077,164 | 3/1978 | Peterman, Jr. . |
| 4,084,942 | 4/1978 | Villalobos . |
| 4,161,436 | 7/1979 | Gould . |
| 4,184,380 | 1/1980 | Rivin . |
| 4,207,154 | 6/1980 | Lemelson . |
| 4,214,037 | 7/1980 | Galasso et al. . |
| 4,228,142 | 10/1980 | Holcombe, Jr. et al. . |
| 4,324,803 | 4/1982 | Bergmann et al. . |
| 4,354,328 | 10/1982 | Ainoura . |
| 4,363,854 | 12/1982 | Hodes et al. . |

(List continued on next page.)

FOREIGN PATENT DOCUMENTS

| | | |
|---|---|---|
| 1061592 | 11/1953 | France . |
| 1240668 | 8/1960 | France . |
| 47-44438 | 2/1969 | Japan . |
| 57-106513 | 12/1980 | Japan . |
| 60-195094 | 3/1984 | Japan . |
| 61-106494 | 10/1984 | Japan . |
| 61-124573 | 11/1984 | Japan . |
| 62-72921 | 9/1985 | Japan . |
| 61-196371 | 2/1986 | Japan . |
| 774052 | 5/1957 | United Kingdom . |
| 825026 | 12/1959 | United Kingdom . |
| 841387 | 7/1960 | United Kingdom . |
| 1482526 | 8/1977 | United Kingdom . |

OTHER PUBLICATIONS

Nuckolls, J., Emmett, J. and Wood L., "Laser-induced thermonuclear fusion", Physics Today, Aug. 1973.
Transactions of the American Nuclear Society, 1977 Annual Meeting, Jun. 1977.
Larson, R.L., "The Mid–Cretaceous Superplume Episode", Scientific America, Feb. 1995.

Primary Examiner—Joseph M. Moy
Attorney, Agent, or Firm—Niro, Scavone, Haller & Niro

[57] ABSTRACT

An article includes a base substrate having an outer surface, a visible marking placed on the outer surface, a coating of transparent synthetic diamond material bonded to the outer surface and over the visible marking.

17 Claims, 1 Drawing Sheet

U.S. PATENT DOCUMENTS

| | | |
|---|---|---|
| 4,385,880 | 5/1983 | Lemelson . |
| 4,475,319 | 10/1984 | Wirz . |
| 4,494,651 | 1/1985 | Malcolm ................................ 220/663 |
| 4,554,208 | 11/1985 | MacIver et al. . |
| 4,585,704 | 4/1986 | Hirai et al. . |
| 4,594,294 | 6/1986 | Eichen et al. . |
| 4,610,577 | 9/1986 | Spensberger . |
| 4,663,183 | 5/1987 | Ovshinsky et al. . |
| 4,693,231 | 9/1987 | Buschmeier . |
| 4,707,384 | 11/1987 | Schachner et al. . |
| 4,725,345 | 2/1988 | Sakamoto et al. . |
| 4,734,339 | 3/1988 | Schachner et al. . |
| 4,764,434 | 8/1988 | Aronsson et al. . |
| 4,802,807 | 2/1989 | Offenburger et al. . |
| 4,809,862 | 3/1989 | Canty ...................................... 220/663 |
| 4,859,493 | 8/1989 | Lemelson . |
| 4,874,596 | 10/1989 | Lemelson . |
| 4,920,703 | 5/1990 | Hosoya . |
| 4,960,643 | 10/1990 | Lemelson . |
| 4,971,602 | 11/1990 | Crawford . |
| 4,974,498 | 12/1990 | Lemelson . |
| 5,040,501 | 8/1991 | Lemelson . |
| 5,067,826 | 11/1991 | Lemelson . |
| 5,096,352 | 3/1992 | Lemelson . |
| 5,131,941 | 7/1992 | Lemelson . |
| 8,207,582 | 9/1965 | Inque . |

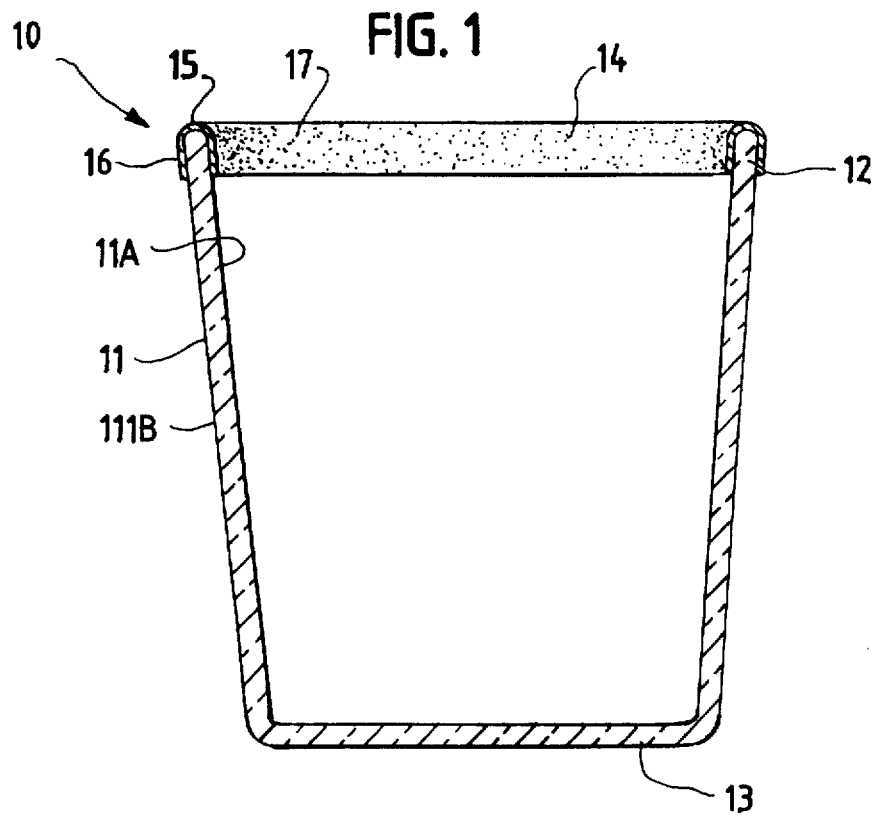
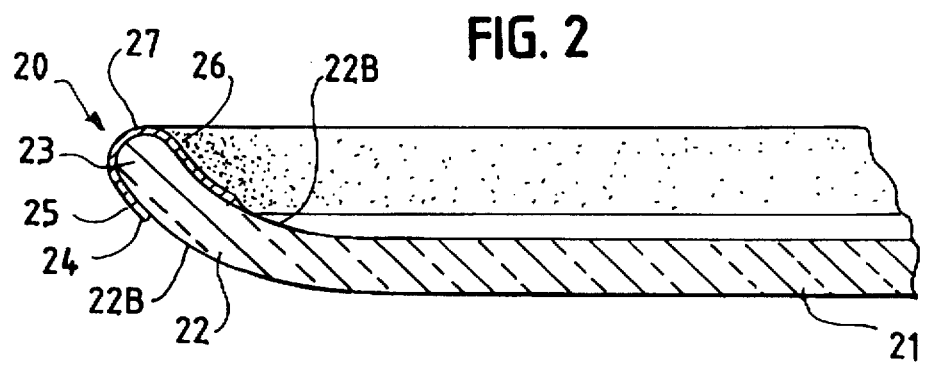
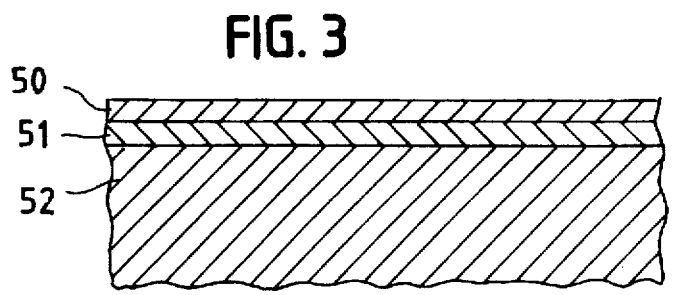

SHEET MATERIAL WITH COATING

This is a Division of application Ser. No. 08/108,103, filed on Aug. 16, 1993 now abandoned.

SUMMARY OF THE INVENTION

This invention relates to improvements in articles of manufacture made of easily breakable materials, such as glass and ceramic materials, wherein the strength of a select portion thereof such as the rim of a drinking glass, cup, bowl, plate, cover or other manufactured article is reinforced with a high strength material which serves to prevent chipping and cracking during use cleaning or handling. In a preferred form of the invention, drinking cups and glasses, bowls, plates and the like have their rims, which circumscribe the open upper ends thereof, coated with a synthtic diamond or diamond-like material. In another form, the rim portions of cups, glasses, bowls, jars and other containers are formed of a synthetic diamond or diamond-like material, which like the coated rims, resist chipping, cracking and breaking.

Conventional drinking glasses and bowls may easily chip along their peripheral rims which poses a hazzard to the user who may swallow the chipped glass or ceramic material. Furthermore, such chipped glasses, bowls and cups are often subject to easy breakage if dropped or stressed at the chipped portion or are easily subject to additional chipping thereat with the added hazzard that the chipped glass or ceramic material may be ingested with food. When subject to shock, such as when disposed in a washing machine or used in a microwave oven, chipped cups, drinking glasses and bowls may more readily develop cracks which extend along their side walls and result in failure with extended use.

While the invention is primarily directed to the use of synthetic diamond coatings and the like to prevent cracking and chipping of select portions of articles, it is also concerned with the use of such diamond coatings formed in situ of transparent films to protect and retain the appearance of surface finishes such as defined by the surfaces of plastic moldings, polished or plated metal such as sheet metal and trim, colored or transparent coatings such as paints and polymers on articles, panels and structural members, wood panels and the like from degradation die to scuffing, scratching, surface chipping and other forms of damage.

The invention is also directed to improvements in the structures of articles of manufacture, such as liquid containing drums, pipe and tubing subject to corrosion and erosion during use and methods for coating the interior surfaces thereof with synthetic diamond material by forming same from carbon atoms or carbon atom containing material deposited thereon.

The invention is also concerned with methods for forming articles and structural members of manufacture made entirely or partly of synthetic diamond or diamond-like material by the processes of molding, casting or extruding same to shape.

It is known in the art to form synthetic diamond or diamond like materials as coatings on articles of manufacture by stripping carbon atoms from gaseous hydrocarbon molecules in a reaction chamber using suitable microwave energy. Reactions involving methane gas and hydrogen gas mixtures have produced hard synthetic diamond or diamond-like films on substrates when microwave energy is generated and directed through such gas mixture at the substrate. Plasmas generated by microwave energy in the vicinity of a substrate containing finely derided carbon particles in a hydrogen atmosphere have also been used to form hard synthetic diamond films of such carbon on the substrate. Reference is made to such as U.S. Pat. Nos. 4,960,643; 4,974,498; 5,021,628; 5,040,501; 5,096,352 and 5,132,587 for further details of such coating processes and apparatus for producing such coatings. Where employed per se hereafter the term synthetic diamond refers to synthetic films, formed as described, exhibiting hardness and other characteristics of diamond. Such films may be also be produced by heating protodiamond polymers or the like applied as liquid and/or particles of such polymers to a select portion or portions of an article such as by molding, dipping, spraying, roll coating, vapor deposition or other means while the article is at an elevated temperature and/or the polymer and article or select portion thereof is heated to convert the polymer or a portion thereof to synthetic diamond and to bond same to the select surface portion of the article. One form of such processing also involves bonding the crystalline synthetic diamond particles or film to the surface(s) on which they are formed by heating and melting the surface stratum of the substrate against which the polymer is disposed and converted to synthetic diamond. Such heating a melting may be effected by the selective application of laser or microwave energy to the article which energy may also be used to form the synthetic diamond crystals or film on the substrate.

In those methods where some graphite is formed along with synthetic diamond from the carbon polymer, it may be etch with acid or otherwise removed whereafter additional solution or liquid containing such polymer may be applied to the surface and processed again to form synthetic diamond thereof to complete the coating process and/or build up the thickness of the coating layer.

Where employed per se, the term "synthetic diamond" as applied to coatings and articles made of chemically vapor deposited molded, extruded or otherwise formed materials containing carbon atoms which are caused to crystallize into synthetic diamond, may also refer to such diamond-like materials formed of, compounded or doped with one or more other elements such as nitrogen, hydrogen, boron, silicon, tungsten, aluminum, titanium, iron or other metal or a combinations thereof.

It is also known in the art to produce synthetic diamond or diamond-like materials from carbon polymers having certain of the carbon atoms thereof arrayed in a diamond-like arrangement. Such a carbon polymer has been developed at Penn State University and may be formed as fine grained particles which may be mixed in a liquid or solution for coating onto a surface. When such coating is properly heated in the range of about 390 to 750 degrees F. the so arranged carbon atoms may be converted to synthetic diamond and to form a coating thereof.

Finely divided particles of carbon, such as graphite, may also be made to form a coating of synthetic diamond on a substrate when subjected to suitable high temperature such as present in a plasma generated, for example, by microwave energy. Such particles may be mixed with a liquid or solution operable to bond same to surfaces to which the liquid is applied by spraying, dipping, roller coating or other means. Such carbon particles may also be pressed or propelled against an outer layer of a metal, glass or ceramic material rendered molten by radiation, such as a laser light beam scanned across the surface as the particles are so applied thereto whereafter suitable plasma radiation may be generated and directed to such surface to cause the carbon particles bonded thereto to form synthetic diamond as a solid layer or film thereof or as separate synthetic diamond particles. Thus the composites described may be formed by applying solid carbon and/or hydrocarbon particle containing coatings to a substrate, to temperatures in the range of about 390 to 750 degrees F. so as to yield acid resistent carbon and synthetic diamond structures which may be used to protect the substrate against corrosion and erosion during use.

Accordingly it is a primary object of this invention to provide new and improved structures in articles of manufacture subject to corrosion, erosion and breakage.

Another object is to provide new and improved structures in lined containers and conduits subject to internal wear and corrosion.

Another object is to provide improved structures in pipe and pipe fitting subject to the corrosive effects of fluids carried thereby.

Another object is to provide an improved tube and pipe structure which will resist degradation by corrosion and erosion as well as clogging due to solid materials adhering to the inside wall surfaces thereof.

Another object is to provide an improved flexible tubing structure having an interior surface structure which is resistant to erosion and corrosion.

Another object is to provide new and improved structures in food and liquid containers made of glass and ceramic materials which are normally subject to rim chipping and cracking.

Another object is to provide a drinking glass or cup made of a frangible material, such as glass or ceramic and having a rim surrounding an open end thereof which rim is reinforced with a high strength material such as synthetic diamond provided as a coating over and around the rim.

Another object is to provide a drinking glass or cup made of glass or ceramic material, a portion of the wall of which is formed of synthetic diamond material.

Another object is to provide a container or utensil made of a frangible material such as glass and having a rim portion of a wall thereof formed of synthetic diamond or diamond-like material.

Another object is to provide improvements in articles of manufacture formed of frangible glass or ceramic with rim portions which may chip, crack or shatter, which rim portions are reinforced with synthetic diamond material which serves to reinforce and strengthen same.

Another object is to provide new and improved articles of manufacture made of frangible glass material, which articles are completely or selectively coated with synthetic diamond or diamond-like material to prevent them from chipping, cracking or shattering.

Another object is to provide a method for forming synthetic diamond or diamond-like coatings on substrates.

Another object is to provide new and improved structural materials containing synthetic diamond or diamond-like material and methods for forming same.

Another object is to provide improved methods for forming coatings of synthetic diamond or diamond-like materials on various articles of manufacture such a food and drinking utensils, container and the like made of glass.

Another object is to provide improved methods for automatically coating articles of manufacture and select portions thereof with synthetic diamond or diamond-like material.

Another object is to provide new and improved articles of manufacture made of synthetic diamond and diamond-like material and improvements in such synthetic diamond-like material.

With the above and such other objects in view as may hereinafter more fully appear, the invention consists of novel structures, methods and apparatus for forming coatings of synthetic diamond and diamond-like materials on articles of manufacture and articles formed of such materials as will be more fully described and illustrated in the accompanying drawings, but it is to be understood that changes, variations and modifications may be resorted to which fall within the cope of the invention as claimed.

In the drawings:

FIG. 1 is a side view in cross section of an improved drinking glass or cup the rim of which is reinforced to prevent chipping and cracking;

FIG. 2 is a partial side view in cross section of a bowl or plate with a similarly reinforced peripheral rim or edge.

FIG. 3 is the cross-sectional view of the material.

In FIG. 1 is shown a drinking glass or cup 10 made of glass or other suitable ceramic material and having a side wall 11 and bottom wall 13. Circumscribing the open upper end of the side wall 11 is a rim 12 of smoothed or rounded configuration. Extending over and around the rim 12 is a coating 14 of a hard material which serves to strengthen the rim 12 and prevent the material thereof from chipping or cracking during use. In a preferred form of the invention, the coating 16 is formed of synthetic diamond or diamond like material formed in situ against the end surface of the rim 12 and preferably extending as shown for distances along the inside surface 11A and outside surface 11B of the sidewall 11 of the container or drinking implement 10. The construction illustrated may be applied to various containers which are subject to constant use and are made of material, such as conventional glass or ceramic, which may chip or crack along the rim portions of the container due to impact with other objects such as other similar containers, hard surfaces or other implements or to heat shock or vibration, or a combination of such attritions.

The hard coating 14 is of annular configuration and has a central portion 15 formed against the rim, an external portion 16 extending a distance down the outer surface of the side wall 11 and an internal portion 17 extending a distance down the inside surface of the side wall. Such distances may vary from ⅛ to ½ inch or more and may be equal or different from each other depending on structural requirements and how the coating is applied.

The coating 14 may be formed by applying a carbon atom containing material, such as a polymer, by dipping the rim below the surface of a container thereof, by spraying, roller applying, mold coating or other means and thereafter applying sufficient radiant heat, microwave energy, or other form of radiation or a combination thereof to the coating material and at least a portion if not all of the material of the container at a sufficient intensity and for a sufficient period of time to either cause the coating material to convert to synthetic diamond or diamond-like material and/or to strip carbon atoms thereof from their molecules to form such coating of carbon which is converted to a synthetic diamond or diamond-like material. The coating material may be varied in its properties by adding select amounts of one or more other elements to either the solid, liquid and/or vaporous or gaseous carbon atom containing molecules applied to the rim portion 12 to form diamond-like materials doped or compounded with such other elements which may comprise nitrogen and/or one or more various metals such as aluminum, silicon, titanium, tungsten, etc. A controlled radiation beam, such as a laser beam or plurality of such beams may be employed to effect one or more of the functions of depositing the one or more coating materials, ion implanting one or more materials in the coating or the glass or ceramic material, stripping atoms of carbon from hydrocarbon molecules and depositing such carbon atoms in the configurations described herein, heating the substrate and bonding the coating material thereto and forming the synthetic diamond or diamond-like material during and/or after deposition takes place.

In FIG. 2 is shown another embodiment of the invention comprising a circular plate, bowl, lid or other container 20 formed of a flat base or top wall 21 and having a curved side wall portion 22 extending from the bottom wall 21 and terminating at a circumscribing rim or rim portion 23. The container or bowl 20 may be of any depth with its wall portions defined by an inside surface 21A and an outside surface 21B. Coated over and around the rim 23 is a thin U-shaped layer 24 of synthetic diamond or diamond-like material, portions 25 and 26 of which extend, as described, along select circular portions of the inside and outside surfaces 22A and 22B of the side wall 22 of the bowl or plate 20 for distances varying from about ⅛" to ½" or more. In a particular embodiment, the synthetic diamond layer 24 may extend over and around the rim and may also cover the entire inside surface 21A to protect same against corrosion and/or erosion and to reinforce the entire side and bottom walls of the container 20.

In modified forms of the invention shown in FIGS. 1 and 2, various other types of utensils and applicances made of glass or ceramic material may have select portions of thereof, such as stems, handles, necks, bowl or container portions or the like which are subject to chipping, cracking and breakage, surface scratching, interior erosion and/or corrosion during use, coated with synthetic diamond or diamond-like material as described, or may be made entirely or partly of such hard synthetic diamond material which is also highly resistent to such forms of attrition and breakage. A drinking glass or cup, plate or bowl, cooking utensil; storage jar, flask, drum or conduit such as a length of pipe made of glass or ceramic material which may easily chip, crack or break or may may have its internal surface subject to erosion and/or the corrosive effects of a corrosive liquid or liquids contained therein or passing therethrough, may be entirely interiorally coated with such synthetic diamond or diamond-like material. If one or more forms of such attrition occurs exteriorally, the outside surface of such articles may be so coated or formed of such material. Thus entire lengths of ducting or pipe and tubing including the threaded ends or coupling surfaces thereof and the surfaces of the couplings therefor subject to corrosion and erosion during use may be so coated with the described synthetic diamond or diamond-like material which will be referred to herein as SD/DL material, a term encompassing carbon and compounds containing carbon exhibiting diamond-like characteristics and capable to resisting erosion and surface scratching caused by abrasive particles, expansion and contraction due to uneven heating and the corrosive effects of chemicals. Thus such articles of manufacture may be entirely coated, completely coated on the inside or outside surface or surfaces thereof, selectively internally or externally coated and/or having entire or just select portions thereof formed of synthetic diamond material.

In another form of the invention, synthetic diamond or diamond-like coatings may be formed in film thicknesses in the range of about 0.000004" to 0.0001" or more with such coatings being transparent to permit the color and finish of the surfaces of articles to which they are applied to be viewed while protecting the visible marking from scuffing, scratching and other forms of erosion during use as well as corrosion due to chemicals applied thereto during cleaning and use and in the atmosphere. Such transparent synthetic diamond films may also be applied over printed matter applied to the surfaces of the articles on which the film is formed to protect this type of visible marking as well from destruction or degradation as well as the surface to which the printed matter is applied. Other visible markings, such as the high gloss attained by polished metal or painted surfaces, molded plastics and the glossy surfaces of articles formed by molding, extrusion or casting metals and plastics may have their color and glossy finish retained and protected by such transparent diamond film formed in situ by one or more of the techniques described herein or the like. A particularly useful embodiment is a sheet of metal such as steel or aluminum alloy which is either buffed or glossy finished per se, is coated with or laminated to a transparent polymer or contains a surfacing material defined by one or more coats of paint or plastic and has a glossy finish, may have these visible markings preserved and protected during use from surface attrition such as scuffing, scratching and color or finish loss due to weathering and chemical corrosion with a thin film-like transparent coating of the synthetic diamond or diamond-like material described herein.

Other forms of the invention are noted as follows:

1. The described synthetic diamond or diamond-like films may be applied as described to select portions of glassware to prevent sa me from chipping or cracking during use and particularly during handling and cleaning operations. The following embodiments and new structures in glassware are noted hereinafter wherein the term SD/DL refers to synthetic diamond or diamond-like material or the like, applied to the articles and portions thereof as described above or by the means described hereafter:

a) Drinking glasses and cups made of glass and ceraminc materials are known to easily develope chips or cracks in their rims which are not only unsightly but may be hazzardous if the glass or ceramic chip(s) fall into the food and are swallowed or the chipped portion(s) of the rim retains food or bacteria.

Accordingly an embodyment of the invention defined herein is a drinking glass cup or bowl made of glass, porcelain or other ceramic material which is either entirely coated with a SD/DL material in the order of one or more thousandths of an inch or less or has such SD/DL material coating just the rim thereof in a band extending over and around the rim to a distance of ⅛" to ¼" or more on both surfaces which extend to and define the rim.

b) Bowls and plates made of glass or ceramic material may similarly have their entire outer surfaces coated with such SD/DL material or SD/DL material coating the rim and/or periphery portions thereof to depths varying from several thousands of an inch to a ten thousandth of an inch or less and extending ⅛" to ¼" radially from either or both surfaces defining the rims or peripheries thereof. By so coating the rims or peripheral portions of the glass or ceramic bowls, cups or glasses with chemically vapor deposited (CVD) synthetic diamond or diamond-like material, such annular coatings will provide more durable drinking implements and prevent rim or edge chipping and cracking during use, handling and cleaning operations. If the entire glass, cup or bowl is so coated, coated with a thicker SD/DL layer or made of same, it may be rendered virtually unbreakable during the normal use there of including when the implement or container is dropped.

c) Eating implements, such as glass spoons, forks, knives, mixers, straws or the like may similarly be entirely or partially (rim) coated with SD/DL material to prevent breakage or chipping during use, handling or cleaning.

3. Mixing blades and the like for appliances and industrial mixing equipment may be similarly entirely coated with SD/DL material or have just select portions such as rim portions and/or base or connecting portions thereof so coated to protect same from chipping, cracking or other damage including breakage during use.

4. Propellers, such as marine propellers made of aluminum, brass, steel, titanium, ceramic material or the like, may be so coated (either entirely or select portions such as rim or periphery portions thereof) to protect same from edge chipping or crack ing during use.

5. Just the cutting edge portions of cutting tools, such as knives, scissors, machine tool cutting tools and inserts may be similarly coated for distances of 1/8" to 1/4" or more to protect same from wear, cracking, chipping and other arttriction during use.

In all of the embodiments of the invention, the synthetic diamond outer layer or coating may be of film thickness whereby it is transparent or of greater thicknesses varying from 0.0001 to 0.010" or more whereby it is opaque. Film thickness diamond film coatings may be formed by chemical vapor deposition (CVD) as described employing microwave energy to strip carbon atoms from hydrocarbon gas such as methane in the presence of hydrogen and may vary from about 0.000004" to 0.0001" or more whereby the color or a shade of the color of the substrate coating of paint or polymer or the surface color and (gloss) finish of the substrate outer stratum will be protected and viewable through the transparent film.of synthetic diamond applied thereto as described.

Other embodiments of the invention are noted as follows:

1. In addition to the illustrated drinking glass and bowl or plate, other implements for use in food serving, processing and packaging and laboratory ware may be similarly strengthened or reinforced with coatings of synthetic diamond or diamond-like materials of the types described which coatings may also serve to protect one or more surfaces or select portions of the surfaces thereof from scratching and erosion, chemical corrosion and heat or shock induced surface cracking. Such implements or articles may include various containers, lids and covers; mixing and valve components; optical instrumentation and appliance lenses and other components made of glass or light transmitting plastic subject to scratching and erosion such as eyeglass and contact lenses made of glass or plastic.

2. Optical fibers may be produced as described herein entirely of synthetic diamond or diamond-like material or having core portions of cylindrical external configuration made of light transmitting glass or ceramic material and coated with a cylindrically shaped layer of synthetic diamond or diamond-like material which serves to strengthen and protect the core material from erosion and corrosion and to provide a reflecting interface to permit the fiber to conduct light along its length. The fibers may also be hollow or tubular in shape and coated on the outside and/or inside with such synthetic diamond or diamond-like material. Fittings or coupling members secured to the end or ends of the fiber may be similarly structured or coated.

3. Sheet metal laminates formed of substrates which are roll formed, cast or extruded of metal such as steel, aluminum or other metal element or alloy may have either or both major surfaces thereof coated with synthetic diamond or diamond-like material in thicknesses varying from 0.0001" to 0.010" depending on the thickness of the substrate, the degree of deformation the laminate will be subjected to in its fabrication and the erosive and/or protection against corrosion required thereof. If the sheet is to be fabricated into products such as automotive, aircraft, boat or appliance panels or walls which are exposed, the exterior surfaces of such laminates may be coated per se with a transparent protective film of synthetic diamond or may have one or more coatings of a high temperature paint, polymer or anodized aluminum forming an underlayer of the laminate against the substrate sheet with a thin transparent layer or film of synthetic diamond formed in situ against and bonded to the outer surface of the colored underlayer to serve as a scratch and chemical resistant surface coating for protecting the outer surface of the paint layer of the laminate. Such colored underlayer and synthetic diamond film outerlayer thereon may also be applied after the metal substrate sheet is formed to shape and/or assembled into a structural member, assembly such as a wall panel or other component by forming the synthetic diamond film in situ as described against the fabricated or deformed metal sheet or laminate or assembly including same with or without the plastic or paint coating the substrate or in a matte or glossy condition. If the diamond film is transparent, the color and glossy finish of the paint to which it is applied will be maintained. If utilized to fabricate painted automobile body panels or walls, the outer surface coating of transparent synthetic diamond film will eliminate the need to protect the paint with frequent waxing and polishing. Such synthetic diamond film may also be utilized per se on either or both surfaces of metal sheet such as sheet steel and aluminum for use on boats, automobiles and aircraft to protect same from erosion and the corrosive effects of weathering, salt water, etc.

4. Highway signs made of printed metal sheeting or a retroreflective glass bead coating on metal or plastic sheet may also contain transparent coatings of such synthetic diamond film formed in situ on the surface of the metal, a paint or plastic applied thereto or the outer surface of the glass bead layer or laminate containing such glass beams. The film not only serves to protect the sign surface from erosion due to the impacts of stones and road particles and the effects of weathering but also from the building up of a layer of dust particles and dirt thereon.

5. Steel and aluminum walled drums and other containers may be made of one or more of the materials described above with the outer and/or inner surfaces thereof coated with synthetic diamond material to protect same against corrosion and weathering.

6. Pipe, tubing and fittings therefor may be coated with such synthetic diamond material applied to the surfaces thereof subject to the corrosive and erosive effects of corrosive and particle carrying fluids conducted and contained thereby. To avoid the detrimental and destructive effects of corrosion and weathering the exterior surfaces of same may be so coated.

If the entire inside surface of a length of pipe or tubing is so coated with a synthetic diamond or diamond-like material up to and including, if necessary, the end portions thereof which are engaged and protected from erosion and corrosion by the connecting fittings and the latter are similarly internally and/or externally coated to protect the exposed surfaces thereof from chemical and erosive attack, assemblies of a plurality of such lengths of pipe and joining fittings may be made which are totally protected from the corrosion and erosion of various fluids carried thereby. Depending on the corrosive fluids to be piped and/or on the velocities thereof and the nature and size(s) of the erosive particles to be carried by such fluids, the thicknesses of the synthetic diamond coating may be varied from 0.00001" to 0.010" or greater. If the pipe or tubing is flared, threaded or otherwise shaped at its end(s) the threads and/or flaring may also be so coated to protect same from corrosion. Seals such as metal or plastic O-rings, V or otherwise shaped circular sealing rings or seals made of metal or plastic and employed to join such lengths of coated tube or pipe may also be externally coated with synthetic diamond, if necessary to protect same from chemical corrosion during use.

7. Reinforcing wires or filaments of shore or long length which may be combined with plastic, metal or ceramic matrices may be made entirely of the described synthetic diamond or diamond-like material or coated therewith. Fibers, whiskers or fine wires made of various high strength metals, metal alloys, glass, ceramic, cermet, high strength carbon or a combination thereof may be coated with such synthetic diamond or diamond-like material bonded thereto along the lengths thereof to increase the tensile strength thereof, provide improved surface characteristics such as reduce the possibility of failure due to surface developed cracks and improve the bonding characteristics between the fibers or filaments with the matrix material. To coat such fibers, filaments or high strength whiskers with synthetic diamond film, they may be immersed in a solution containing the described carbon containing polymer either as they are formed while at temperatures in the range of 390 to 750 degrees F. or effect the formation of such synthetic diamond-like film or such raised temperature may be applied by radiant heating, gas flame, microwave energy, induction heating, laser beam or a combination thereof while the fibers are mixed, in a matte-like array or sealed within the matrix in a molding thereof. In the latter method, it is assumed that the solution coating is applied to and at least dried on the fibers, filaments or whiskers prior to encapsulating same in the matrix material by solidifying same about the fibers so that subsequent heating of the composite may be employed to convert the carbon of the polymer of the solution to synthetic diamond as a coating thereof on the fibers. Induction, microwave, radiant or gas heating may be employed to heat both the fibers, wires or whiskers and the matrix material to form such synthetic diamond coatings and set, sinter or crystallize the matrix material.

8. Whiskers or filaments of the described synthetic diamond or diamond-like material may be continuously formed by spinning or extruding the described tetrahedral carbon polymer or other similar carbon atom containing polymer to the shape of a thin wire, tube or rod and thereafter convert all or a select portion of the surface stratum thereof to synthetic diamond or diamond-like material by heating same while continuously fed from the spinnerette or extrusion die, while fed from or in a coil formation thereof, while in a matrix cast or molded thereabout, while coated with another material, while cut lengths of such filaments are in a batch formation thereof, or while they are in free flow through space or a liquid.

9. Other articles of manufacture which may be made of or coated with the described synthetic diamond or diamond-like materials or reinformed with fibers thereof include fasteners such as clothing buttons, zipper and Velcro fastening material(s), marine fittings and the like wherein the synthetic diamond component(s) or coatings provide superior strength and corrosion resistance. Textile threads, sutures and the like made of such synthetic diamond or diamond-like materials or coated therewith may be produced which have superior tensile strength, wear and fray resistances as well as improved insulation and electrical characteristics. Such threads may also be made with cores formed of natural fibers or synthetic resins such as polyamides, polyesters, polypropylenes, and a variety of other known common or so-called engineering resins which are spun or extruded to shape.

10. Architectural materials such as sheets or slabs of glass, plastic, carbon, slate, marble, granite, or other natural stone or formations thereof such as terrazzo, laminates or the like may be coated as described with a transparent coating or film of synthetic diamond or diamond-like material formed in situ on a major face thereof such as a face or surface subject to erosion due to wear or weathering and/or to corrosion such as caused by atmospheric chemicals. Such thin transparent coatings or films of synthetic diamond or diamond-like material will not detract from the appearance of the stone or substantially change its surface structure or shape but may be used to protect same against wear caused by scuffing, scratching, chipping and cracking as well as chemical corrosion. In addition, thin synthetic diamond coatings may operate yo seal the pores of certain stone or materials made of stone as well as other building materials subject to such attrition. If the building material is used out of doors, the diamond film will prevent moisture and rain water from penetrating the surface stratum thereof and cracking or chipping caused by freezing and expansion of the penetrated water.

Such stone as well as other architectural shapes or objects may have select portions of their surfaces including the entire surface area thereof so coated with synthetic diamond by chemical vapor deposition (CVD) techniques, as described, and/or by spraying particles of carbon polymer or carbon against the object or articles wherein such spraying is effected from a nozzle or nozzles disposed across the conveyor and controlled in their operation(s) by control signals generated by an image analyzing computer of the type disclosed in U.S. Pat. No. 4,979,029 employing one or more television cameras to scan the objects or stone sections as they are conveyed past the cameras and particle or vapor applicators. The image analyzing computer generates digital codes which define the contour(s) of the objects which codes are employed to control the operation of one or more pumps or solenoids which operate to effect proper control of the spray or deposition means to flow the deposition material just against the select portion(s) of the select surface(s) of each object as it is conveyed past the nozzles or flow generating means. By using this flow application and control technique, coating material may be spray or otherwise flow applied to just the surface(s) of conveyed objects and the flow thereof will terminate when each object has passed the spray head or heads. If a spray manipulator is employed to effect coating, its motors may be so controlled in their operation to controllably move the spray nozzle or fluid applicator thereof in a manner such that sprayed material will be selectively deposited against just the surface(s) of the object to be coated and will be terminated when such selective coating is completed by controlling the movement of the spray head of the spray manipulator and a valve or pump flowing coating material thereto in response to the feedback signals generated by the image analyzing computer analyzing the image signals generated when the TV camera scans the object on the fly or while stationary.

11. Filtration devices and structures may be fabricated of filaments or whiskers made of or coated with synthetic diamond or diamond-like materials of the types described. They may be produced by holding a matted array of whiskers or filaments so made in a frame, by bonding such filaments or whiskers into a pad or sheet-like formation or by one or more of the following techniques:

a) A matted array of filaments or wires made of glass, metal, ceramic or organic or inorganic material such as a polymer is first formed. One or more of the initial coating materials such as carbon atoms or particles of carbon or carbon polymer of the type described herein is then flowed in a liquid solution or as a gas or vapor thereof through the interstices of the matted array of filaments and is caused to deposit on and surround the contacting filaments whereafter heat or microwave energy is applied to the matting at sufficient intensity and for a sufficient period of time to form the described diamond-like film or coating on the exposed surfaces of the filaments of the matte.

b) A matte is formed of filaments made of carbon polymer wherein the filaments are either bonded together or in engagement where they cross each other. Sufficient heat and/or microwave energy is then applied to the material of the matte to convert either the surface stratum of the filaments or the entire filament material to synthetic diamond or diamond-like material as described.

12. Composite articles, panels or structural members, tubing, pipe sheet, rod, sheet strip, filaments, netting or other shapes may be extruded, cast, spun or cavity molded to shape of very high temperature resistant plastic or plastic-ceramic composite materials, such as Starlite, a plastic composition compounded of twenty one polymers and ceramic material, and an outer layer or coating of synthetic diamond or diamond-like material formed in situ on at least one surface or the entire inner and/or outer surfaces thereof by one or more of the methods described herein. The high temperature resistance of the material of the substrate or structural member not only renders the article formed of such composite material temperature resistent during use but also permits the formation of synthetic diamond as a film or layer on the surface thereof at relatively high temperature by applying microwave energy or others of the forms of radiation described to form and bond the synthetic diamond layer to the substrate. In other words, unlike other conventional plastic polymers, most of which melt or vaporize in the range of 100–250 degrees centigrade, the very high temperature resistent composite may receive carbon atoms or larger particles of carbon which may be processed with microwave and/or plasma energy to form same into synthetic diamond film or thicker layers, as described, without melting or destroying or degrading the substrate material.

Articles of manufacture or components thereof which may be so fabricated with a protective wear and corrosion resistent outer layer of synthetic diamond, include printed or painted documents, signs, works of art, labels, coverings for laminates of sheet metal, glass or other material and products formed in part of same wherein superior heat, wear, scuff, scratch and corrosion resistance are required. Such composite very high temperature resistent polymer-diamond film laminate in sheet form may also be employed to fabricate articles to be worn such as shoes, boots, belts, jackets, hats or headgear and the like, as a flexible leather or rubber-like material used per se or laminated to leather and/or one or more other polymeric or natural textile material in sheet form. Filaments formed of such very high temperature resistent polymer per se or coated with synthetic diamond material as described may be woven into flexible textile or reinforcing material for composite which is resistent to high temperature, wear and corrosion degradation or destruction.

13. Gaskets, gasketing and packing material for use at elevated temperatures may be molded, die-cut of sheet or braided material formed of braided filaments of such very high temperature resistent polymer or polymer which is synthetic diamond coated as described.

14. Any of the products described herein may be formed of, coated with or laminated to and composite of high strength carbon, such as high strength graphite, or one or more woven layers of filaments thereof having an outer coating of synthetic diamond or diamond-like material as described.

In FIG. 3 is shown structural details of the synthetic diamond coatings, the protective overcoatings and the substrates coated. The substrate, which may be any of the configurations hereinabove described, is denoted 50 and is made of suitable metal, metal alloy, ceremet or ceramic material or combinations thereof fabricated by casting, molding, extrusion, machining, forging or one or more of such processes. The synthetic diamond coating 51 may be deposited as carbon atoms stripped from molecules of such gas as methane or other hydrocarbon, vaporous hydrocarbon or carbon atom containing material, combinations of gas and vapor carbon atom containing materials, preferably with suitable hydrogen gas mixed therewith to provide suitably efficient deposition and synthetic diamond layer formation to the desired thickness which may vary in the range of 0.000001" to 0.010" and, for most applications in the range of a few millions of all inch to a few thousandths of an inch. The overcoating 52 of chromium is shown completely covering the synthetic diamond coating 51 and may be applied by electroless or electrical deposition, vapor deposition, detonation or plasma plating. Thickness of depths of such overcoating may range from 0.0001 to several thousands of an inch or more and preferably in the range of a few thousands of an inch or less.

The substrate 52 of FIG. 3 may also be made of a number of materials other than metal, metal alloys or ceramic material as described. For certain applications involving the structures described it may be made of mixtures of ceramic or metal powder or a combination of both per se of mixed with short synthetic diamond filaments or particles shaped, dimensioned and produced as set forth in my copending patent application Ser. No. 032,352 filed Mar. 31, 1987 providing a rigid matrix which is reinforced by such particles and, in certain applications, tailored in chemical and electrical characteristics to perform select functions as a high strength insulating, semiconducting or conducting material or as a heat conducting or insulating material, the surface or surfaces of which are protected front corrosion, erosion and frictional wear and failure due to forces applied thereto during operational use by either or both the coatings 50 and 51.

FIG. 3 may also represent a portion of a flexible substrate 52 made of a plastic resin such as a suitable polymer or copolymer; random or aligned fibers such as paper made from woodpulp or other material or woven material such as a cloth, canvas or reinforcement for a composite material such as carbon—carbon having either or both major surfaces thereof coated with synthetic diamond material formed in situ thereon by chemical vapor deposition utilizing microwave energy to strip carbon atoms from molecules of a hydrocarbon liquid or gas such as methane by means such as described above and in my copending application Ser. No. 032,352 and U.S. Pat. No. 4,859,493.

In a particular embodiment of the structure of FIG. 2 the substrate 52 may comprise a sheet of fibrous material such as paper or paperboard, canvas or the like having either or both the major surfaces thereof coated with a thin film of synthetic diamond material and having a valuable painting or print of art rendered on one of the surfaces thereof. The following forms of the invention are noted:

1. In a first form of the invention, the substrate 52 is a sheet of flexible or rigid fibrous material, such as paper or paperboard, canvas or the like containing printing material such as printing ink or painting material such as paint in the form of painting oils, acrylic or other material represented by the layer 51 which may or may not be absorbed into the surface stratum of substrate 51 as in most painted works of art. Layer 50 which is formed in situ and deposited on the outer surface of paint layer 51 or directly against the outer surface of substrate 52 is a thin film of synthetic diamond material which serves to protect the painting and the substrate from degradation due to atmospheric chemicals. The synthetic diamond material may be deposited as a thin transparent film in the range of thicknesses between 0.000001" to 0.0001" and is preferably, although not necessarily less than about 0.00001" in thickness. While the synthetic diamond film may be utilized per se to protect the outer surface of the painting from chemical attack and to prevent cracking of the paint as it ages, it may also be overcoated with a thin coating of a plastic resin such as a suitable polymer or copolymer which may be utilized to protect the outer surface of the diamond film from abrasion and reduce its possibility of failure therein such as cracking during handling or mounting same of a support. If fine voids or pin holes occur in such synthetic diamond film during its formation, such plastic film or coating may be employed to fill or cover such voids and strength and flexibility to the laminate without adversely affecting the painting or print. However, the synthetic diamond film may be utilized per se to protect substantially the entire painting or print from chemical degradation, particularly if such print or painting is supported in a frame behind a sheet of glass or rigid plastic.

2. In a second form of the invention a laminate is first formed of a sheet substrate 52 made of fibrous material such as paper, paperboard, canvas or the like and has one of its major surfaces 52S on which printed matter or a painting of value is to be made by an artist, coated with a thin layer or film 51 of synthetic diamond material formed in situ thereon as described by stripping carbon atoms from carbon atom containing molecules with microwave energy as described. The painting or print is then applied to the outer surface of the diamond film which may vary in thickness from a few millionths of an inch to a thousandth of an inch or more. A thin coating of clear or white colored plastic resin may be automatically applied to the outer surface of the diamond film onto the outer surface of which plastic may be printed or hand painted artwork or the like. The diamond film serves as a barrier against moisture and chemicals which may be present in or pass through the paper or paperboard substrate. After the painting or printed matter is completely applied to the outer surface of the first layer of synthetic diamond or a subsequent layer of plastic resin thereon, a second layer of synthetic diamond material is formed in situ against the outer surface of the painting or print completely covering all the printed matter or paint and exposed plastic of first layer of synthetic diamond laminating the paint or printed matter and hermetically sealing same therebetween.

3. In a third form of the invention a thin layer or film of synthetic diamond material is applied as described to the back of a sheet of paper, canvas or other suitable material either prior to or after printed matter or a painting has been formed on on the opposite surface thereof. Once the printed matter or paint forming a work of art has been so applied to the other surface of the sheet, a thin coating of synthetic diamond material is applied thereover including any exposed surface portion(s) of the sheet not printed or painted on. In other words, the entire other surface of the print or painting is coated with synthetic diamond material as described. The coating on the back side of the sheet seals the sheet itself from the atmosphere and moisture therein as well as any pollutants preventing same from adversely afffecting both the sheet or paper and the printed matter or paint on the other surface thereof. The synthetic diamond coating on the front face of the painting or print seals such surface and hermetically seals the painting, print and paper or canvas between itself and the synthetic diamond material coating the opposite side thereof. The outer surface of the thin layer of synthetic diamond material, which may be applied in the range of thicknesses described above to the outer surface of the painting or print may remain diamond film or may be overcoated with a thin layer of transparent plastic as described above to enhance the strength of the laminate and protect the diamond film. Such plastic layer may be a preformed sheet of clear plastic flim such as a polyester resin, polycarbonate, polyamide or Nylon, etc.

In the print or painting preservation structures and techniques described above, synthetic diamond film and/or clear plastic film may be applied to the four edges of the paper or canvas sheet to coat or impregnate same in a manner to seal same from moisture and atmospheric gases to prevent same from penetrating the laminate from the edges thereof. Tightly clamping the print or painting between a glass sheet and a backing sheet may serve the same purpose and may be used to preserve the print or painting for an extremely long period of time. Painting or printing on diamond film applied to a face of a sheet material will not only protect the paint or ink from interacting with chemicals in the paper or base sheet or with chemicals and moisture penetrating said sheet from the rear, but will also strengthen such sheet material and limit or prevent its stretching to the determent of the painting or print applied thereto.

4. In a fourth form of the invention, a laminate of a print or painting and one or more sheets of plastic and/or glass sheet may have its entire outer surfaces coated with synthetic diamond material as described, thereby sealing such laminate in synthetic diamond material against moisture and atomspheric molecule penetration. If the laminate or a portion thereof is made of a porous material containing atmospheric molecules accessible to the surface(s) of the laminate, it may be placed in a chamber which may be evacuated of air just prior to application of the synthetic diamond coating which may be formed of atoms of carbon stripped from molecules of a hydrocarbon gas controllably fed into the vacuum chamber along with suitable hydrogen to the exclusion of contaminants such as air or other molecules until the coating process is complete.

A number of techniques and apparatus maye be employed to coat paintsings, prints and the like with synthetic diamond. In one, a waveguide for suitable microwave energy is automatically driven in controlled scanning movement across a surface of the painting, print or sheet while methane or other suitable hydrocarbon gas is flowed into the guide against the surface of the painting and suitable microwave energy is generated and passed through the guide to cause carbon atoms of the gas to be stripped from the gas molecules and deposited onto the surface of the painting or paper until predetermined coating is completed. In a second technique, the painting, print or its laminate as described above is placed and either held stationary or contollably moved in a coating chamber into which hydrocarbon gas (such as methane) is controllably flowed while suitable microwave energy is generated and directed against all or a selected location of the painting. In a third form, the microwave energy generator is moved or controlled to cause microwave energy to scan the sheet causing the scanning deposition of carbon atoms as synthetic diamond film on incremental portions of the painting or sheet. In a forth arrangement, the sheet, painting or print is rolled into a loose coil formation with suitable spacing between surface portions to allow methane gas or the like to be flowed through such spacing while microwave energy is directed against the coil formation to deposit carbon atoms as a film of synthetic diamond material of select thickness.

The substrate 52 may comprise a variety of natural or synthetic flexible materials such as paper, plastic sheet or film, parchment, canvas, leather, woven fabrics metal foils laminates of such materials or such sheet materials coated with a suitable plastic layer or film against the outer surface of which the synthetic plastic material may be deposited as a thin film. Such laminates of flexible substrate sheet, and a plurality of coatings thereon including a first layer of plastic if needed to render the surface of the substrate non-porous, a layer of synthetic diamond material on the surface of the substrate or plastic coating thereon and an overcoating of flexible colored or transparent plastic or preformed plastic film, may be utilized to provide flexible material for a variety of products in which the synthetic diamond coating addes substantially to the strength and abrasion resistance. If the overcoating of plastic is omitted, the synthetic diamond layer itself may serve to offer great resistance to wear and scuffing or abrasion, add to the total strength of the flexible laminate and, in certain applications, serve as a heat insulating layer.

In a modified form of the invention, it is noted that filaments of electrical resistance material, such as tungsten filaments and the like employed in incandescant lamps, may be formed of such material coated with a synthetic diamond material having an overcoating of chromium or the like, as described so as to greatly enhance the life of such filaments and increase the timed failure caused, for example, by the expansion and contraction of the material when the lamp is energized and de-energized. A tungsten filament for a conventional light bulb may be coated with synthetic diamond film per se along its entire length to a thickness in the range of 0.00001" to 0.001" depending on its size and the application parameters thereof. Similarly, the base or support fur such filament, if not glass, may be coated with diamond film of similar thickness as may any fastening or operational devices attached to the filament within the lamp enclosure.

The terminals of incandescent lamps, lamp sockets and connectors may be similarly coated with thin diamond film material to protect same against moisture and chemical corrosion as well as erosion due to arcing or current discharge.

Electrodes employed in other forms of lamps, radiation emitting devices, cathode ray tubes, fuel cells and batteries may be similarly coated with thin film synthetic diamond material varying from 0.00001" to 0.001" depending on the voltage and amperage ranges applied thereto and other operating parameters.

Also shown in FIG. 1 is a sealing ring or washer 22 disposed between the threaded lower end 15 and a stepped portion of the metal shell 12 to provide a pressure seal between the plug and the combustion chamber. Such sealing ring may be made of solid metal, such as copper or formed metal sheet or tube and may be coated with a thin layer, as described, of synthetic diamond material applied thereto per so or having an overcoating of a protective metal such as chromium or other metal as described to strengthen, protect and insulate the sealing ring.

The coatings of synthetic hard diamond or diamond-like material applied to the entire articles or select portions of such articles subjected to frictional wear, weathering, temperature or chemical corrosive effects, and destruction caused by the expansion of surface defects such as surface cracks formed during fabrication, may be formed of carbon atoms deposited thereon from gas, vapor or liquid molecules containing such carbon atoms, as a result of passing high intensity radiation, such as microwave radiation or the like, through such carbon atom containing fluids, by means shown and described in my parent application Ser. No. 32,307, now U.S. Pat. No. 4,859,493, in thicknesses which may vary from a few millionths of an inch to a thousandth of an inch or more depending on the expected use of the articles or assemblies including the corrosive and erosive atmosphere to which they are subjected. Thicker films in the order of 0.0001" to 0.001" or more may be provided to substantially enhance the tensile and compressive strengths of the articles or components. Where the article or component is subjected to movement and abrasion or frictional wear during use, which wear or abrasion may have a detrimental effect on the diamond film or coating, a thin coating of a solid lubricant protective material, such as chromium, chromium alloys or the like, may be applied over the diamond coating after it is formed in situ on the substrate or select portion of the outer surface thereof. Such chromium may also be deposited as chromium atoms present in the gas, vapor or liquid disposed adjacent the surface of the article, while carbon atoms are deposited or sequentially after the deposition of carbon atoms to provide either a composite layer of carbon and chromium atoms or one or more layers of carbon atoms interposed between one or more layers of chromium atoms or coatings thereof.

Certain modifications of the structures and methods for making same may be found in my parent application Ser. No. 32,307, now U.S. Pat. No. 4,859,493 and in pending patent application Ser. No. 032,352 filed Mar. 31, 1987, reference being made directly thereto as part of the instant disclosure. Further modifications are noted as follows:

1. Scanning a select portion or portions of the surface or surfaces of the articles described and illustrated in the drawings with one or more radiation beams of laser and/or electron radiation may be effected to provide such coating or coatings on a select area or areas of the outer suface or surfaces of the articles to the exclusion of another area or areas thereof for functional and/or economic purposes. Such an electon beam or laser beam may be employed in combination with microwave radiation and passed through a carbon atom containing gas, such as methane, surrounding all or part of the article or assembly to be coated, and employed to effect or increase the rate of deposition of carbon atoms to form the synthetic diamond coating and/or to heat the substrate to bond the deposited material(s) to the substrate.

2. Such functions as the operation of the radiation beam generating means, the intensity and frequency thereof, if varied, the direction and focus thereof, the flow and replenishment of carbon atom containing gas and hydrogen gas to the reaction chamber and, if employed, flow thereof as one or more streams within such chamber to the vicinity of the surface(s) being coated, the movement and/or prepositioning of the article or material being coated to, within and from the reaction chamber and the flow of any additional material, to be combined with the carbon atoms in the coating, to the reaction chamber and surface of the article(s) being coated, may all be automatically controlled by a computer with or without the generation of feedback signals generated by one or more sensors of such variables as deposited coating thickness, rate of deposition, temperature, beam position, article position, etc.

3. Synthetic diamond coatings as described may be overcoated with protective coatings of chromium, alloys containing chromium, metal alloys containing such metal atoms as vanadium, tungsten, titanium, molybdenum and/or such metals per se, which serve to protect and/or lubricate the surface of the synthetic diamond coatings to resist frictional wear and abrasion during operation and use of the coated article. In certain applications, the synthetic diamond coating will serve to electrically insulate the article. In others, it will protect the surface coated therewith from heat and/or chemical corrosion. In others, the surface(s) coatings will impart greater resistance to wear and abrasion. Surface attrition due to impact forces and loading during use may also be lessened or eliminated by such hard synthetic diamond coating(s) which may be applied as a single or plurality of layers per se or combined or overcoated with one or more layers of the described metals and/or metal alloys to lubicate and protect the surface of the synthetic diamond coating.

4. Coatings formed of a plurality of layers of synthetic diamond material formed as described between respective layers of the same or different metals, metal alloys and/or ceraimic materials may be employed to enhance the physical, chemical resistance and electrical characteristics of the articles described. Such multiple coatings may also be employed to substantially enhance the strength and stiffness of the articles.

5. Fasteners and fastening components of the types illustrated in the drawings and described above may also be made substantially of synthetic diamond material by forming same of particles of synthetic diamond sintered in a die with a plastic or metal binder or mixed with powdered or molten metal and shaped in a die or mold. Such synthetic diamond particles may be made by the means disclosed in my U.S. Pat. No. 4,859,493 and held together as molded or pressed between dies with aluminum, titanium or other metal coated on the particles per se or by also providing particles of the same or a different metal in a homogeneous mixture the diamond particles and compacting the mixture between dies while heat is applied thereto to weld the mixture into a solid shape.

Methods for forming synthetic diamond and diamond-like coatings on articles of manufacture such as appliances of the types described above are noted as follows:

1. In a first method, one or more of such articles are placed in or passed through a reaction chamber or duct on a conveyor wherein a gas or vapor is flowed therethrough containing hydrogen and carbon atom containing molecules, such as methane gas with or without a select amount of other molecules and atoms of material to be compounded or otherwise combined with the carbon atoms when deposited on the entire or mask-exposed surface or surfaces of each article. Thereafter suitable radiant energy such as microwave energy is generated and directed from one or more generators thereof through such gas and/or vapor to the article(s) to cause tcarbon atoms to be stripped from their molecules and deposit on the exposed surface or surfaces of the articles while they are in motion and/or held stationery. Such carbon atoms form a thin coating of synthetic diamond or diamond-like material on the surface or surfaces onto which they are deposited. The surface or surfaces being coated may be suitably masked or selectively coated with a material which may be easily etched or washed off after the areas therebetween have been diamond coated if it is desired to limit the coating to a surface area such as a rim.

2. In a second method, directed radiant energy such as a narrow beam or beams of microwave or laser light energy may be caused to scan a select portion of the area of a substrate to cause carbon atoms, as in the above method, to form synthetic diamond film along the scanned area.

3. in a third method, a polymer is formed containing carbon atoms which can be converted to synthetic diamond or diamond-like material with the suitable application of heat thereto. One form of such polymer which yields a diamond-like material has been developed by the Pennsylvania State Research Division is composed of a network of carbon atoms in a pyramid shaped arrangement of such atoms which may dissolved in water or other solvent and may be heated to modest temperatures (390 to 750 depress F.) to form clear crystalline diamond-like material. By mixing such polymer with such matrix forming materials as molten metal, plastic resin or glass or with powdered metal, glass, ceramic, cermet or the like or a combination of such materials and heating same to a molten condition, maintaining the melt to form the carbon atom containing polymer into synthetic diamond particles in the mix and then forming the melt to shape by injection or compression molding, casting, extrusion, spray molding against the wall of a die, mold or otherwise shaped substrate, new and improved structural materials and articles of manufacture may be produced. The diamond particles so formed may be substantially homogeneously distributed throughout the matrix to form high strength bonds and interfaces for the crystallites formed of the matrix material(s). Homogeneous mixtures consisting of solid particles of metal matrix material and such carbon atom containing polymer may also be employed to form articles by sintering such mixture to shape in a die or mold wherein the heat applied to effect such sintering may also be used to convert the carbon material to synthetic diamond.

Articles of manufacture of the types described may be produced on an automatic flexible (FMS) production line basis employing automatic conveying, coating and heating machinery for selectively coating and converting deposited carbon atoms to synthetic diamond or diamond-like films and thicker layers thereof as described. The coatings may be applied by automatic dipping, spraying, roller applying or in-mold coating all or select portions of the surfaces of such articles or elongated materials with the described carbon polymer in molten, powder or liquid solution while in motion or stationary in a conveying system which carries the coated articles past heating means of the type described or through furnace or radiant heating tunnels to form and bond the synthetic diamond material of the coating material in-situ on the select area or areas of the surfaces of the articles.

The articles may also be coated while automatically conveyed through an elongated sealed chamber having a continuous supply of carbon atom containing molecules of gas and/or vapor defining compounds, hydrogen gas and one or a plurality of microwave energy generators disposed along the path of travel of the articles to deposit and convert carbon atoms to films or thicker layers of synthetic diamond or diamond-like material.

If the polymer or other carbon atom containing fluid is spray applied to the articles as they are conveyed, a computer controlled manipulator for the spray head may be disposed adjacent the article conveyor and may employ one or more television cameras or electro-optical sensors to scan the objects and generate image signals such as full-frame video picture signals modulated with image information about the articles. The video signals are computer analyzed in real time by an image analyzing computer, such as defined in my U.S. Pat. Nos. 4,979,029 and 4,653,109 wherein code signals are generated which are indicative of coordinates of select portion of the articles, such as select borders thereof and are employed to control the motors operating the manipulator and the valve or pump for the sprayed material to deposit such prediamond material just where it is needed on the surface or surfaces of the article. The television camera controlled spray application technique may also employ a plurality of cameras and spray manipulators to selectively coat one or a plurality of surfaces of each article without overspraying, with or without the use of one or more spray masks which may also be positioned by an automatic manipulator(s) which may be controlled in operation by the image analyzing computer generated control signals to position and remove the mask from the select location required during spraying to properly apply the sprayed material to each article while it is in motion or stopped on or adjacent the conveyor. In other words, the results of computerized image analysis comprises code signals defining coordinates of select locations of the surface or surfaces of the article to be coated and such code signals are either used to directly control the manipulator and spray controlling motor to apply sprayed material just where needed to coat just a select area or areas of the article.

In a preferred form of the embodiment described above, a master computer is employed to control the operations of the conveyor, the spray manipulator and/or means for flowing a gas or vapor of molecules containing carbon atoms to the chamber or surfaces of the articles on which synthetic diamond material is to be formed, the operation (and manipulation or deflection control if applicable) of the radiation generating means employed to convert the carbon particles or atoms to synthetic diamond. Feedback signals may be generated by sensors, such as one or more television cameras, photoelectric sensors and the like sensing reflected and/or fluorescence radiation from the member or conveyed articles prior to and during coating and converting the coating material to synthetic diamond, which feedback signals may be utilized to control the conveyor, manipulation or positioning mechanisms for the articles being coated and subject to radiation, the spray manipulator and spray head therefor, and the radiation generating and application means which may comprise a microwave generator, resistance heating elements, laser, gas burner or a plurality or combination thereof employed to properly coat, heat, convert and bond the in situ formed synthetic diamond film or coating to the surfaces of the articles. Such automatic control system may also be employed to automatically spray coat articles with powder or atomized liquid sprayed from one or more automatic spray-manipulators disposed adjacent an automatic conveyor for such articles with or without further processing such as heating the coating material further down the line or as coating occurs.

What is claimed is:

1. An article of manufacture comprising:

a base substrate defined at least in part by a sheet of material having a generally planar surface;

said substrate further including an outer surface;

a visible marking placed on a predetermined portion of said outer surface;

a coating of transparent synthetic diamond material bonded to said predetermined portion of said outer surface and over said visible marking; and said coating of transparent synthetic diamond material sealingly covers said visible marking.

2. An article of manufacture in accordance with claim 1 wherein said coating of synthetic diamond material is formed on said planar surface and said sheet of material is selected from the group of materials consisting of glass, metal, plastic, carbon, ceramics, paper, paperboard, parchment, canvas, leather, cloth, and laminates thereof.

3. An article of manufacture in accordance with claim 2 wherein a thickness of said coating is between and including 0.000001 inches and 0.0001 inches.

4. An article of manufacture in accordance with claim 2 further comprising a coating of protective material bonded between said planar surface and said coating of synthetic diamond material.

5. An article of manufacture in accordance with claim 4 wherein said coating of protective material is selected from the group consisting of paint, polymers, retroreflective glass bead and anodized aluminum.

6. An article of manufacture in accordance with claim 2 wherein said sheet of material is a sheet of metal and wherein a thickness of said coating of synthetic diamond material is between and including 0.0001 inches and 0.010 inches.

7. An article of manufacture in accordance with claim 1 wherein said sheet of material is a sheet of paper and said marking comprise a photograph.

8. An article of manufacture in accordance with claim 1 wherein said sheet of material is a sheet of paper and the combination of said sheet of paper and said marking thereon comprise a document.

9. An article of manufacture in accordance with claim 1 wherein said sheet of material takes the form of a sign wherein said coating of synthetic diamond material protects said marking on said sign.

10. An article of manufacture in accordance with claim 1 further comprising a coating of synthetic diamond material between said planar surface and said marking.

11. An article of manufacture in accordance with claim 1 wherein said coating of synthetic diamond material is formed against and bonded to all surfaces of said sheet of material.

12. An article of manufacture in accordance with claim 1 wherein said sheet of material has a plurality of edges and said coating of synthetic diamond material is bonded to said edges.

13. An article of manufacture in accordance with claim 1 wherein said material is a stone selected from the group consisting of slate, marble, granite, terrazzo, and laminates thereof.

14. An article of manufacture in accordance with claim 2 wherein said sheet of material is fashioned to a predetermined shape before said coating of synthetic diamond material is formed against and bonded thereto.

15. An article of manufacture in accordance with claim 14 wherein said sheet of material is assembled into a structural member assembly before said coating is bonded thereto.

16. An article of manufacture in accordance with claim 1 wherein said substrate comprises a fibrous material, further comprising a coating of plastic resin bonded to said coating of synthetic diamond material.

17. An article of manufacture in accordance with claim 4 wherein said coating of synthetic diamond material is formed on and bonded to said coating of protective material in an airless environment.

* * * * *